(12) United States Patent
Kato et al.

(10) Patent No.: US 9,902,825 B2
(45) Date of Patent: Feb. 27, 2018

(54) RESIN COMPOSITION, PREPREG, AND LAMINATED SHEET

(71) Applicant: MITSUBISHI GAS CHEMICAL COMPANY, INC., Tokyo (JP)

(72) Inventors: Yoshihiro Kato, Abiko (JP); Takaaki Ogashiwa, Kashiwa (JP); Hiroshi Takahashi, Misato (JP); Tetsuro Miyahira, Shirakawa (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 15/363,395

(22) Filed: Nov. 29, 2016

(65) Prior Publication Data

US 2017/0073485 A1  Mar. 16, 2017

Related U.S. Application Data

(62) Division of application No. 13/816,008, filed as application No. PCT/JP2011/069393 on Aug. 29, 2011, now abandoned.

(30) Foreign Application Priority Data

Aug. 31, 2010 (JP) .................. 2010-194390

(51) Int. Cl.
| | |
|---|---|
| *C08J 5/24* | (2006.01) |
| *H05K 1/03* | (2006.01) |
| *C08K 3/00* | (2018.01) |
| *B32B 5/26* | (2006.01) |
| *B32B 15/14* | (2006.01) |
| *C08K 3/26* | (2006.01) |
| *B32B 15/092* | (2006.01) |

(52) U.S. Cl.
CPC .................. *C08J 5/24* (2013.01); *B32B 5/26* (2013.01); *B32B 15/092* (2013.01); *B32B 15/14* (2013.01); *C08K 3/0083* (2013.01); *C08K 3/26* (2013.01); *H05K 1/0373* (2013.01); *B32B 2262/10* (2013.01); *B32B 2307/3065* (2013.01); *B32B 2307/58* (2013.01); *B32B 2307/734* (2013.01); *B32B 2457/08* (2013.01); *C08J 2363/00* (2013.01); *C08J 2363/04* (2013.01); *C08K 2003/267* (2013.01); *H05K 2201/012* (2013.01); *H05K 2201/0209* (2013.01); *Y10T 428/31529* (2015.04)

(58) Field of Classification Search
CPC ..................................................... C08L 63/00
See application file for complete search history.

(56) References Cited

U.S. PATENT DOCUMENTS

| | | |
|---|---|---|
| 4,346,012 A | 8/1982 | Umaba |
| 6,043,306 A | 3/2000 | Imahashi |
| 6,130,282 A | 10/2000 | Imahashi |
| 7,438,898 B1 | 10/2008 | Sako |
| 2006/0166760 A1 | 7/2006 | Higuchi |
| 2009/0017316 A1 | 1/2009 | Kato et al. |
| 2010/0166684 A1 | 7/2010 | Kokeguchi |
| 2011/0045213 A1 | 2/2011 | Ieshige |
| 2011/0101222 A1 | 5/2011 | Iida |
| 2012/0009836 A1 | 1/2012 | Ueno et al. |
| 2013/0045650 A1 | 2/2013 | Ogashiwa et al. |
| 2013/0089743 A1 | 4/2013 | Ogashiwa et al. |

FOREIGN PATENT DOCUMENTS

| | | |
|---|---|---|
| CN | 101343412 | 1/2009 |
| CN | 101522792 | 9/2009 |
| CN | 101643570 | 2/2010 |
| JP | 2-255843 A | 10/1990 |
| JP | 03-190965 | 8/1991 |
| JP | 5-170984 | 7/1993 |
| JP | 2002-531672 | 9/2002 |
| JP | 2002-284844 A | 10/2002 |
| JP | 2004-059643 | 2/2004 |
| JP | 2007-204697 A | 8/2007 |
| JP | 2009-35728 | 2/2009 |
| KR | 20090006788 | 1/2009 |

OTHER PUBLICATIONS

Search report from International Application No. PCT/JP2011/069393, dated Nov. 22, 2011.
International Preliminary Report on Patentability PCT/JP2011/069393, dated Mar. 21, 2013.
Professional translation of JP 03190965 A, retreived Sep. 16, 21014.

*Primary Examiner* — Megan McCulley
(74) *Attorney, Agent, or Firm* — Greenblum & Bernstein, P.L.C.

(57) ABSTRACT

A prepreg for printed wiring boards that has a low coefficient of thermal expansion in a plane direction, has excellent heat resistance and drilling workability, and, at the same time, can retain a high level of flame retardance includes a base material, a resin composition impregnated into or coated on the base material, and huntite. The resin includes (A) an inorganic filler that is a mixture composed of a hydromagnesite represented by $xMgCO_3 \cdot yMg(OH)_2 \cdot zH_2O$ wherein x:y:z is 4:1:4, 4:1:5, 4:1:6, 4:1:7, 3:1:3, or 3:1:4; (B) an epoxy resin; and (C) a curing agent. The prepreg can be used to prepare a laminated sheet and a metal foil-laminated sheet.

14 Claims, No Drawings

RESIN COMPOSITION, PREPREG, AND LAMINATED SHEET

CROSS-REFERENCE TO RELATED APPLICATIONS

This application is a Divisional Application of U.S. patent application Ser. No. 13/816,008, filed Feb. 8, 2013, which is a National Stage of International Application No. PCT/JP2011/069393, filed Aug. 29, 2011, which claims priority to Japanese Patent Application No. 2010-194390, filed Aug. 31, 2010. The disclosures of U.S. patent application Ser. No. 13/816,008 and International Application No. PCT/JP2011/069393 are expressly incorporated by reference herein in their entireties.

TECHNICAL FIELD

The present invention relates to a resin composition and more particularly relates to a resin composition for use in prepregs for printed wiring boards. The present invention also relates to a prepreg for printed wiring boards prepared using the resin composition, and a laminated sheet and a metal foil-clad laminated sheet prepared using the prepreg.

BACKGROUND ART

In recent years, there is an ever-increasing tendency towards high-density integration, high function, and high-density assembly of semiconductors extensively used, for example, in electronic equipments, communication instruments, and personal computers. This has led to a demand for better properties and higher reliability of laminated sheets for semiconductor plastic packages. In particular, there is a recent demand for a reduction in coefficient of thermal expansion in a plane direction of laminated sheets. When the difference in coefficient of thermal expansion between a semiconductor element and a printed wiring board for a semiconductor plastic package is large, warpage occurs in the semiconductor plastic package due to the difference in coefficient of thermal expansion upon exposure to thermal shock, sometimes leading to poor connection between the semiconductor element and the printed wiring board for a semiconductor plastic package or between the semiconductor plastic package and the printed wiring board mounted.

In addition, due to an increasing recent tendency toward an increase in density, high adhesion to copper foils for micro wiring formation and machinability in hole making by drilling or punching are required of copper-clad laminated sheets. Further, for electronic components, mounting by lead-free solder and imparting flame retardance without use of halogens have become required due to a growing interest in environmental problems, and, to meet this requirement, higher heat resistance and flame retardance than those of conventional products are required.

In order to meet the above requirements for a reduction in coefficient of thermal expansion, drilling workability, heat resistance, and flame retardance, metal hydrates are known as halogen-free flame retardants as an alternative to bromine-containing flame retardants. For example, aluminum hydroxide is known as a flame retardant that, when heated, causes a reaction that releases water of crystallization. When the amount of gibbsite that is a general structure of aluminum hydroxide is large, heat resistance is deteriorated due to an influence of water of crystallization that is released upon heating. The incorporation of boehmite obtained by hydrothermally treating aluminum hydroxide is also known (see, for example, patent document 1). Copper-clad laminated sheets prepared using boehmite are superior in heat resistance to those prepared using aluminum hydroxide, but on the other hand, drilling workability and coefficient of thermal expansion in a plane direction are unsatisfactory. Further, a mixture composed of hydromagnesite and huntite is known to improve flame retardance. However, only one example of the use of the mixture in thermoplastic resins such as polyolefin resins is described (see, for example, patent document 2), and the resin is not used for laminated sheet applications. Thus, the effect attained by this technique regarding a reduction in coefficient of thermal expansion and an improvement in heat resistance and drilling workability that are required of the laminated sheet applications has not been found.

A method in which an inorganic filler or an organic filler is filled into resins is known to reduce the coefficient of thermal expansion in a plane direction of laminated sheets (see, for example, patent document 3). This method suffers from a problem that increasing the amount of the inorganic filler filled into the resins to further lower the coefficient of thermal expansion is disadvantageous in that the resultant resin composition is hard and fragile, the abrasion of drill bits is fast, and breakage of drill bits and a lowering in the accuracy of hole position lead to an increased frequency of replacement of drill bits, resulting in a deteriorated drilling workability.

PRIOR ART DOCUMENTS

Patent Documents

Patent document 1: Japanese Patent Application Laid-Open No. 59643/2004
Patent document 2: Japanese Patent Application Laid-Open No. 170984/1993
Patent document 3: Japanese Patent Application Laid-Open No. 35728/2009

SUMMARY OF THE INVENTION

Problems to be Solved by the Invention

An object of the present invention is to provide a resin composition for printed wiring boards that has a low coefficient of thermal expansion in a plane direction, has high heat resistance and drilling workability, and can retain a high level of flame retardance, a prepreg prepared using the resin composition, and a laminated sheet and a metal foil-clad laminated sheet prepared using the prepreg.

Means for Solving the Problems

The present inventors have found that the use of a prepreg comprising a base material impregnated or coated with a resin composition comprising an inorganic filler (A) that is a mixture composed of hydromagnesite and huntite, an epoxy resin (B), and a curing agent(C) can provide a laminated sheet that has a low coefficient of thermal expansion in a plane direction relative to the amount of the inorganic filler, has high heat resistance and drilling workability, and can retain a high level of flame retardance. The present invention has been made based on such finding.

According to one aspect of the present invention, there is provided a resin composition comprising:

(A) an inorganic filler that is a mixture composed of a hydromagnesite represented by formula (1):

$$x\mathrm{MgCO_3}\cdot y\mathrm{Mg(OH)_2}\cdot z\mathrm{H_2O} \tag{1}$$

wherein x:y:z is 4:1:4, 4:1:5, 4:1:6, 4:1:7, 3:1:3, or 3:1:4 and huntite;

(B) an epoxy resin; and
(C) a curing agent.

According to another aspect of the present invention, there is provided a prepreg comprising: a base material; and the resin composition impregnated into or coated on the base material.

According to still another aspect of the present invention, there is provided a laminated sheet comprising a lamination-molded product of the prepreg.

According to a further aspect of the present invention, there is provided a metal foil-clad laminated sheet comprising a lamination-molded product of the prepreg and a metal foil provided on the prepreg.

Effect of the Invention

The laminated sheet obtained from the prepreg comprising the resin composition according to the present invention impregnated into or coated on a based material has an excellent heat resistance, has a high level of flame retardance without the need to use a halogen compound or a phosphorus compound, has an excellent drilling workability, and has a low coefficient of thermal expansion in a plane direction relative to the amount of an inorganic filler and thus is usable as materials for semiconductor packages of which various properties are required.

MODE FOR CARRYING OUT THE INVENTION

Resin Composition

The resin composition according to the present invention comprises: an inorganic filler (A) that is a mixture composed of hydromagnesite and huntite; an epoxy resin (B); and a curing agent (C). The resin composition may comprise other ingredients such as a maleimide compound and a silicone powder. The individual ingredients constituting the resin composition will be described.

Inorganic Filler (A)

The inorganic filler (A) used in the present invention is formed of fine particles obtained by grinding a mineral that is a homogeneous mixture of two ingredients that are naturally occurring hydromagnesite and huntite.

The hydromagnesite has a structure represented by formula (1):

$$x\text{MgCo}_3 \cdot y\text{Mg(OH)}_2 \cdot z\text{H}_2\text{O} \qquad (1)$$

wherein x:y:z is 4:1:4, 4:1:5, 4:1:6, 4:1:7, 3:1:3, or 3:1:4.

The hydromagnesite particularly preferably has a structure of $4\text{MgCO}_3 \cdot \text{Mg(OH)}_2 \cdot 4\text{H}_2\text{O}$ from the viewpoint of a flame retarding effect.

The huntite has a structure represented by formula (2):

$$\text{Mg}_3\text{Ca(CO}_3)_4 \qquad (2).$$

The hydromagnesite:huntite mixing ratio may vary but is preferably in the range of 10:90 to 45:55, more preferably in the range of 15:85 to 40:60 from the view point of a flame retarding effect of the inorganic filler (A).

In the present invention, preferably, the inorganic filler (A) has a particle diameter of 0.2 to 100 µm. This inorganic filler (A) may be of a commonly commercially available industrial grade. Examples thereof include Ultracarb1200 manufactured by Minelco and Hypercarb2050 manufactured by Minelco.

In the present invention, the amount of the inorganic filler (A) incorporated is preferably approximately 5 to 250 parts by weight, more preferably 30 to 200 parts by weight, particularly preferably 60 to 150 parts by weight, based on 100 parts by weight in total of the epoxy resin (B) and the curing agent (C). When the amount of the inorganic filler (A) incorporated is not less than 5 parts by weight, a flame retarding effect of the inorganic filler (A) is obtained. On the other hand, when the amount of the inorganic filler (A) incorporated is not more than 250 parts by weight, the drilling workability is good.

The inorganic filler used in the present invention may also be a combination of the mixture composed of hydromagnesite and huntite with inorganic fillers other than the mixture composed of hydromagnesite and huntite. Any inorganic filler commonly used for printed wiring materials may be used without particular limitation as the inorganic filler that may be combined with the inorganic filler that is a mixture composed of hydromagnesite and huntite.

Examples thereof include silicas such as naturally occurring silica, fused silica, amorphous silica, and hollow silica, molybdenum compounds such as boehmite, molybdenum oxide, and zinc molybdate, alumina, talc, calcined talc, mica, glass short fibers, and spherical glass (for example finely divided glass such as E-glass, T-glass, D-glass, S-glass, and Q-glass).

Regarding the inorganic filler (A), the indispensable ingredients may also be used in combination with silane coupling agents and wetting/dispersing agents. The incorporation of silane coupling agents or wetting/dispersing agents can contribute to improved dispersibility of the inorganic filler. Any silane coupling agent commonly used in surface treatment of inorganic materials may be used without particular limitation. Specific examples thereof include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. The coupling agents may be used solely or in a proper combination of two or more of them. Any dispersion stabilizer commonly used for coating materials may be used as the wetting/dispersing agent without particular limitation. Examples thereof include wetting/dispersing agents such as Disperbyk-110, Disperbyk-111, Disperbyk-180, Disperbyk-161, BYK-W996, BYK-W9010, and BYK-W903 manufactured by BYK Japan K.K.

Epoxy Resin (B)

Any epoxy resin commonly used as materials for printing wiring boards may be used as the epoxy resin (B) used in the present invention without particular limitation. Typical preferred examples of the epoxy resin (B) are non-halogen epoxy resins from the viewpoint of a growing concern about environmental problems. Examples thereof include bisphenol A epoxy resins, bisphenol F epoxy resins, phenol novolak epoxy resins, cresol novolak epoxy resins, bisphenol A novolak epoxy resins, trifunctional phenolic epoxy resins, tetrafunctional phenolic epoxy resins, naphthalene epoxy resins, biphenol epoxy resins, aralkyl novolak epoxy resins, alicyclic epoxy resins, polyol epoxy resins, compounds obtained by epoxidizing a double bond, for example, in glycidylamines, glycidyl esters, and butadiene, and compounds obtained by reacting hydroxyl-containing silicone resins with epichlorohydrin. Among them, at least one of phenol novolak epoxy resins and aralkyl novolak epoxy resins is preferred from the viewpoint of improving flame retardance and heat resistance, and aralkyl novolak epoxy resins represented by formula (3) are more preferred from the viewpoint of further improving flame retardance. Aralkyl novolak epoxy resins include phenol phenyl aralkyl epoxy resins, phenol biphenyl aralkyl epoxy resins, and naphthol aralkyl epoxy resins. Phenol phenyl aralkyl epoxy resins represented by formula (4) are particularly preferred. The use of one of or a proper combination of two or more of them may also be possible depending upon contemplated purposes.

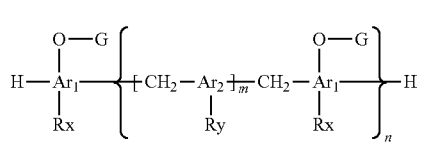
(3)

wherein $Ar_1$s, which may be the same or different, represent and $Ar_2$ represents or when present in plural which may be the same or different, represent an aryl group in which the substituent is a monocyclic or polycyclic aromatic hydrocarbon of a phenyl, naphthyl, or biphenyl group; Rxs, which may be the same or different, represent and Ry represents or when present in plural which may be the same or different, represent a hydrogen atom or an alkyl or aryl group; m is an integer of 1 to 5; n is an integer of 1 to 50; and G represents a glycidyl group.

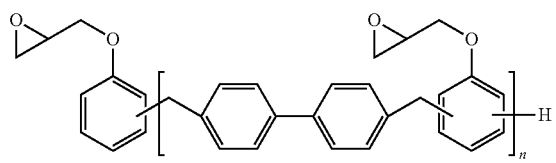
(4)

wherein n is an integer of 1 or more.

The amount of the epoxy resin (B) is preferably approximately 5 to 70 parts by weight, particularly preferably approximately 10 to 40 parts by weight, based on 100 parts in total of the epoxy resin (B) and the curing agent (C). When the amount of the epoxy resin (B) is not less than 5 parts by weight, a contemplated cured product can be obtained while, when the amount of the epoxy resin (B) is not more than 70 parts by weight, good heat resistance can be obtained.

Curing Agent (C)

The curing agent (C) used in the present invention is not particularly limited as long as commonly used epoxy resins are curable. Examples thereof include cyanate ester compounds and BT resins (bismaleimide triazine resins) that are excellent in heat resistance, particularly in electrical characteristics such as permittivity and dielectric loss tangent, and phenolic resins that have low water absorption and high heat resistance. They may be used solely or in a proper combination of two or more of them.

Any common publicly known cyanate ester compounds may be used as the cyanate ester compound. Examples thereof include naphthol aralkyl cyanate ester compounds represented by formula (5), 1,3-dicyanatobenzene, 1,4-dicyanatobenzene, 1,3,5-tricyanatobenzene, bis(3,5-dimethyl-4-cyanatophenyl)methane 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, 2,2'-bis(4-cyanatophenyl)propane, bis(4-cyanatophenyl) ether, bis(4-cyanatophenyl) thioether, bis(4-cyanatophenyl)sulfone, 2,2'-bis(4-cyanatophenyl) propane, bis(3,5-dimethyl, 4-cyanatophenyl)methane, phenol novolak cyanate ester compounds. Among them, naphthol aralkyl cyanate ester compounds represented by formula (5) are particularly suitable for use from the viewpoint of improving flame retardance.

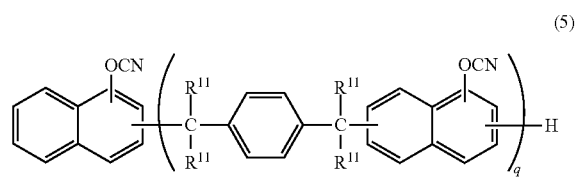
(5)

wherein $R^{11}$ represents a hydrogen atom or a methyl group; and q is an integer of 1 or more.

Any BT resin that is composed mainly of a maleimide compound and a cyanate ester compound and has been prepolymerized may be used as the BT resin without particular limitation. Examples thereof include products obtained by heat-melting 2,2-bis(4-cyanatophenyl)propane (CX, manufactured by Mitsubishi Gas Chemical Co., Inc.) and bis(3-ethyl-5-methyl-4-maleimidiphenyl)methane (BMI-70, manufactured by K.I. Chemical Industry Co., Ltd.) and polymerizing the melt, and products obtained by heat-melting novolak cyanate ester resins (Primaset PT-30, manufactured by Lonza Japan, cyanate equivalent: 124 g/eq.) and bis(3-ethyl-5-methyl-4-maleimidiphenyl)methane (BMI-70, manufactured by K.I. Chemical Industry Co., Ltd.), polymerizing the melt, and dissolving the polymer in methyl ethyl ketone.

Among them, BT resins containing naphthol aralkyl cyanate ester compounds can maintain heat resistance by virtue of a resin skeleton having a rigid structure and can reduce a reaction inhibition factor to enhance curability and thus to realize excellent water absorption and heat resistance and thus are suitable for use by virtue of these properties. One type of or a proper mixture of two or more of cyanate ester compounds that are raw materials for BT resins may be used Any resins having two or more phenolic hydroxyl groups per molecule may be used as the phenolic resin without particular limitation. Examples thereof include naphthol aralkyl phenolic resins represented by formula (6), phenol novolak resins, alkyl phenol novolak resins, bisphenol A novolak resins, dicyclopentadiene phenolic resins, xylok phenolic resins, terpene-modified phenolic resins, polyvinyl phenols, naphthol aralkyl phenolic resins, biphenyl aralkyl phenolic resins, naphthalene phenolic resins, and aminotriazine novolak phenolic resins. They may be used solely or in a proper combination of two or more of them. Among them, at least one resin selected from the group consisting of naphthol aralkyl phenolic resins, biphenyl aralkyl phenolic resins, and naphthalene phenolic resins is preferred from the viewpoints of water absorption and heat resistance, and naphthol aralkyl phenolic resins represented by formula (6) are more preferred from the viewpoint of further improving water absorption.

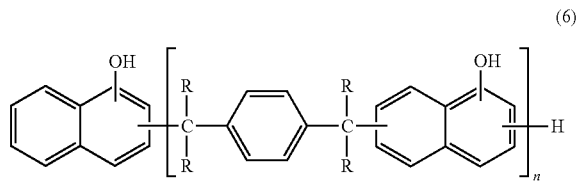

(6)

wherein R represents a hydrogen atom or a methyl group; and n is an integer of 1 or more.

When the phenolic resin is incorporated, the phenolic resin is incorporated so that the ratio of the number of hydroxyl groups in the phenolic resin to the number of glycidyl groups in the epoxy resin is preferably 0.7 to 2.5. The ratio of the number of hydroxyl groups in the phenolic resin to the number of glycidyl groups in the epoxy resin is preferably not less than 0.7 from the viewpoint of preventing a lowering in glass transition temperature and is preferably not more than 2.5 from the viewpoint of preventing a lowering in flame retardance. The phenolic resin may also be used in combination with BT resins obtained by prepolymerizing a cyanate ester compound or a combination of a cyanate ester compound with a maleimide compound.

Other Ingredients

The resin composition according to the present invention may further comprise a maleimide compound. The maleimide compound has the effect of improving heat resistance. Any maleimide compound containing one or more maleimide groups per molecule may be used as the maleimide compound in the present invention. Specific examples thereof include N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, polyphenyl methane maleimide, prepolymers of these maleimide compounds, or prepolymers of a combination of maleimide compounds with amine compounds. These compounds may be used solely or in a proper combination of two or more of them. Bis(4-maleimidephenyl)methane, 2,2-bis{4-(4-maleimidephenoxy)-phenyl}propane, and bis(3-ethyl-5-methyl-4-maleimidephenyl)methane are more suitable.

The amount of the maleimide compound used is preferably approximately 3 to 50 parts by weight, particularly preferably 5 to 30 parts by weight, based on 100 parts by weight in total of the epoxy resin (B), the curing agent (C), and the maleimide compound.

The resin composition according to the present invention may further comprise a silicone powder. The silicone powder functions as an auxiliary flame retardants that delay a combustion time and enhance a flame retarding effect. Further, the silicone powder has the effect of enhancing drilling workability. Examples of such silicone powders include products obtained by finely dividing a polymethyl silsesquioxane to which siloxane bonds are crosslinked in a three-dimensional network form, products obtained by finely dividing an addition polymerization product of a vinyl group-containing dimethylpolysiloxane and a methylhydrogenpolysiloxane, products obtained by covering the surface of a fine powder of an addition polymerization product of a vinyl group-containing dimethylpolysiloxane and a methylhydrogenpolysiloxane with a polymethylsilsesquioxane to which siloxane bonds are crosslinked in a three-dimensional network form, and products obtained by covering the surface of an inorganic support with a polymethylsilsesquioxane to which siloxane bonds are crosslinked in a three-dimensional network form. The average particle diameter (D50) of the silicone powder is not particularly limited. Preferably, however, the average particle diameter (D50) is 1 to 15 μm from the viewpoint of dispersibility. D50 means a median diameter which is a diameter that, when a measured particle size distribution of the powder is divided into two groups, the amount of particles on a coarser side is equal to the amount of particles on a finer side. The D50 value is generally measured by a wet laser diffraction-scattering method.

The amount of the silicone powder incorporated is not particularly limited but is preferably 1 to 30 parts by weight, particularly preferably 2 to 20 parts by weight, based on 100 parts by weight in total of the epoxy resin (B) and the curing agent (C). The amount of the silicone powder incorporated is preferably not less than 1 part by weight from the viewpoint of improving drilling workability and is preferably not more than 30 parts by weight from the viewpoint of preventing a lowering in moldability and dispersibility.

The resin composition according to the present invention may if necessary additionally contain curing accelerators for properly regulating the curing speed. Any curing accelerators commonly used in curing epoxy resins, cyanate ester compounds, and phenolic resins may be used without particular limitation. Specific examples thereof include organic metal salts and imidazole compounds of copper, zinc, cobalt, nickel and the like and their derivatives, and tertiary amines. They may be used solely or in a proper combination of two or more of them.

The resin composition according to the present invention may additionally contain various polymer compounds such as other heat curable resins, thermoplastic resins, and oligomers and elastomers thereof, other flame retarding compounds, and additives in such an amount that does not sacrifice desired properties. They may be generally used without particular limitation as long as they are commonly used in resin compositions for printed wiring boards. Examples of flame retarding compounds include nitrogen-containing compounds such as melamine and benzoguanamine and oxazine ring-containing compounds. Additives include, for example, ultraviolet absorbers, antioxidants, photopolymerization initiators, fluorescent brighteners, photosensitizers, dyes, pigments, thickeners, lubricants, antifoaming agents, dispersants, leveling agents, brighteners, and polymerization inhibitors. These additives may be used in a proper combination according to need.

The resin composition according to the present invention may be produced by any process without particular limitation as long as the inorganic filler (A), the epoxy resin (B), and the curing agent (C) are combined to obtain the resin composition. Examples of production processes include a process that comprises incorporating the inorganic filler (A) into the epoxy resin (B), dispersing the ingredients in each other with a homomixer or the like, and incorporating the curing agent (C) into the dispersion. Preferably, an organic solvent is added from the viewpoints of lowering viscosity, improving handleability, and enhancing a capability of being impregnated into glass clothes.

Prepreg

The prepreg according to the present invention comprises the resin composition impregnated into or coated on a base material. Publicly known base materials used in various materials for printed wiring boards may be used as the base materials used in the production of the prepreg according to the present invention. Examples thereof include glass fibers such as E-glass, D-glass, S-glass, NE-glass, T-glass, Q-glass, and spherical glass fibers, inorganic fibers other than the glass fibers, or organic fibers such as polyimide, polyamide, and polyester fibers. These base materials may be properly selected depending upon contemplated applications and properties. Examples of the form of the base material include woven fabrics, nonwoven fabrics, rovings, chopped strand mats, and surfacing mats. The thickness of the base material is not particularly limited but is generally approximately 0.01 to 0.3 mm. Among these base materials, E-glass fibers are particularly preferred from the viewpoint of a balance between the coefficient of thermal expansion in a plane direction and the drilling workability.

The prepreg according to the present invention may be produced by any process without particular limitation as long as a prepreg comprising a combination of the resin composition comprising the inorganic filler (A), the epoxy resin (B), and the curing agent (C) with the base material can be obtained. For example, the prepreg may be produced by impregnating or coating the base material with a resin varnish comprising the resin composition and an organic solvent and heating the impregnated or coated base material in a drier of 100 to 200° C. for 1 to 60 min to semi-cure the resin. The amount of the resin composition (including the inorganic filler) deposited on the base material is preferably in the range of 20 to 90% by weight based on the whole prepreg.

The organic solvent is used to lower the viscosity of the resin composition, improve the handleability, and, at the same time, enhance impregnation of the resin composition into the glass cloth. Any organic solvent may be used in the resin varnish without particular limitation as long as the epoxy resin (B) and the curing agent (C) can be dissolved therein. Examples thereof include ketones such as acetone, methyl ethyl ketone, methyl isobutyl ketone, and cyclohexanone, aromatic hydrocarbons such as benzene, toluene, and xylene, and amides such as dimethylformamide and dimethylacetamide.

Laminated Sheet

The laminated sheet according to the present invention is a lamination molded product prepared using the prepreg. Specifically, the laminated sheet is produced by providing a single sheet of the prepreg or a stack of a plurality of sheets of the prepreg, optionally placing a metal foil of copper or aluminum on one surface or both surfaces of the single prepreg or the stack, and subjecting the assembly to molding. Any metal foil used in materials for printed wiring boards may be used without particular limitation. Techniques for conventional laminated sheets for printing wiring boards or multilayered boards may be adopted in the lamination molding. For example, the lamination molding is generally carried out under conditions of the use of a multistage press, a multistage vacuum press, continuous molding machine, an autoclave molding machine or the like, a temperature of 100 to 300° C., a pressure of 2 to 100 kgf/cm$^2$, and a heating time of 0.05 to 5 hr. Further, in the present invention, a multilayered board can be formed by lamination molding of a combination of the prepreg with a separately provided wiring board for an internal layer. The present invention is further illustrated by the following Synthesis Examples, Examples, and Comparative Examples.

EXAMPLES

Synthesis Example 1

Synthesis of α-Naphthol Aralkyl Cyanate Ester Compound

A reactor equipped with a thermometer, a stirrer, a dropping funnel, and a reflux condenser was preliminarily cooled with brine to 0 to 5° C. Cyanogen chloride (7.47 g, 0.122 mol), 9.75 g (0.0935 mol) of 35% hydrochloric acid, 76 ml of water, and 44 ml of methylene chloride were charged into the reactor. The temperature within the reactor and pH were kept at −5 to +5° C. and 1 or less, respectively, and, while stirring, a solution of 20 g (0.0935 mol) of α-naphthol aralkyl (compound of formula (VI); all of Rs in the formula representing a hydrogen atom; SN: 485, hydroxyl group equivalent: 214 g/eq., softening point: 86° C., manufactured by Nippon Steel Chemical Co., Ltd.), and 14.16 g (0.14 mol) of triethylamine dissolved in 92 ml of methylene chloride was added dropwise to the contents in the reactor through a dropping funnel over a time period of one hr. After the completion of the dropwise addition, 4.72 g (0.047 mol) of triethylamine was added dropwise thereto over a time period of 15 min.

After the completion of the dropwise addition of the triethylamine, the mixture was stirred at the same temperature for 15 min, followed by separation of the reaction solution to obtain an organic layer. The organic layer was washed twice with 100 ml of water. Methylene chloride was removed by distillation under the reduced pressure with an evaporator, and the residue was finally concentrated to dryness at 80° C. for one hr to obtain 23.5 g of an α-naphthol aralkyl cyanate ester compound.

The cyanate ester resin thus obtained was analyzed by liquid chromatography and an IR spectrum. As a result, peaks attributable to raw materials were not detected. Further, the structure of the cyanate ester resin was identified by 13C-NMR and 1H-NMR. As a result, it was found that the conversion of the hydroxyl group to the cyanate group was not less than 99%.

Synthesis Example 2

Synthesis of BT Resin (BT2610)

2,2-Bis(4-cyanatophenyl)propane (CX: manufactured by Mitsubishi Gas Chemical Co., Inc.) (40 parts by weight) and 60 parts by weight of bis(3-ethyl-5-methyl-4-maleimidephenyl)methane (BMI-70: manufactured by K.I. Kasei K.K.) were melted at 150° C. and were allowed to react with each other until the viscosity of the mixed resin became 12 Pas as measured with a cone-plate viscometer while stirring. The mixed resin was dissolved in methyl ethyl ketone to obtain a BT resin.

Synthesis Example 3

Synthesis of BT Resin (BT9510)

A novolak cyanate ester resin (Primaset PT-30, manufactured by Lonza Japan, cyanate equivalent: 124 g/eq.) (50 parts by weight) and 50 parts by weight of bis(3-ethyl-5-methyl-4-maleimidephenyl)methane (BMI-70: manufactured by K.I. Kasei K.K.) were melted at 150° C. and were allowed to react with each other until the viscosity of the mixed resin became 15 Pas as measured with a cone-plate viscometer with stirring. The mixed resin was dissolved in methyl ethyl ketone to obtain a BT resin.

Example 1

A naphthol aralkyl phenolic resin (SN-495, manufactured by Nippon Steel Chemical Co., Ltd., hydroxyl group equivalent: 236 g/eq.) (45 parts by weight), 55 parts by weight of a phenol biphenyl aralkyl epoxy resin (NC-3000-FH, epoxy equivalent: 320 g/eq., manufactured by Nippon Kayaku Co., Ltd.), 1.5 by weight of a wetting/dispersing agent (BYK-W903, manufactured by BYK Japan K.K.), 90 parts by weight of an inorganic filler that is a mixture composed of hydromagnesite and huntite (Ultracarb1200; hydromagnesite:huntite weight ratio=15 to 30:85 to 70; manufactured by Minelco; structure of hydromagnesite: $4MgCO_3.Mg(OH)_2.4H_2.O$), 10 parts by weight of talc coated with zinc molybdate (ChemGuard 911C, amount of zinc molybdate supported: 10% by weight, manufactured by Sherwin-Williams Chemicals), and 0.01 part by weight of imidazole (2E4MZ, manufactured by SHIKOKU CHEMICALS CORPORATION) were mixed together to prepare a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 4 min to obtain a prepreg having a resin content of 50% by weight.

Preparation of Metal Foil-Clad Laminated Sheet

Four sheets of prepregs were stacked with each other. A 12 μm-thick electrolytic copper foil (3EC-III, manufactured by MITSUI MINING & SMELTING CO., LTD.) was placed on the upper surface and the lower surface of the stack, followed by lamination molding under conditions of a pressure of 30 kgf/cm², a temperature of 220° C., and a time of 120 min to obtain a metal foil-clad laminated sheet having a 0.4 mm-thick insulating layer.

For the metal foil-clad laminated sheets thus obtained, flame retardance, heat resistance, coefficient of thermal expansion, and drilling workability were evaluated.

The copper foil was removed by etching the metal foil-clad laminated sheet before the flame retardance and coefficient of thermal expansion were evaluated by the following method.

Flame retardance: evaluated according to a UL94 vertical combustion testing method using the 0.8 mm-thick etched laminated sheet.

Glass transition temperature: measured with a dynamic viscoelasticity analyzer (manufactured by TA INSTRUMENTS) according to JIS (Japanese Industrial Standards) C 6481.

Coefficient of thermal expansion: determined by providing a thermomechanical analyzer (manufactured by TA INSTRUMENTS), raising the temperature from 40° C. to 340° C. at a temperature rise rate of 10° C./min, and measuring a coefficient of linear expansion in a plane direction from 60° C. to 120° C. The measurement direction was a warp direction of the glass cloth in the laminated sheet.

The heat resistance for the metal foil-clad laminated sheets was evaluated by the following method.

Heat resistance: A sample having a size of 50×50 mm was floated in a solder of 300° C. for 30 min, and the time taken until the occurrence of delamination was measured. When the delamination did not occur until 30 min elapsed from the start of floating in the solder, the heat resistance was expressed as >30 min in the table.

The drilling workability was evaluated in terms of the accuracy of hole positions under the following drilling conditions.

Machining device: ND-1 V212, manufactured by Hitachi Via Asia Pte. Ltd.
Number of superimposed sheets: four metal foil-clad laminated sheets
Entry sheet: LE450, manufactured by Mitsubishi Gas Chemical Co., Ltd.
Backup board: PS-1160D, manufactured by RISHO KOGYO CO., LTD.
Drill bit: MD MC 0.18×3.3 L508A, manufactured by UNION TOOL CO.
Rotating speed: 160 krpm
Feed rate: 0.8 m/min
Hits: 10000

The results of evaluation were as shown in Tables 1 and 2 below.

Example 2

The procedure of Example 1 was repeated, except that 55 parts by weight of a naphthol aralkyl phenolic resin (SN-495) and 45 parts by weight of a phenol novolak epoxy resin (EPICLON N-770, epoxy equivalent: 190 g/eq., manufactured by DIC) as an epoxy resin were used.

Example 3

The procedure of Example 1 was repeated, except that 20 parts by weight of a naphthalene phenolic resin (EPICLON EXB-9500, manufactured by DIC, hydroxyl group equivalent: 153 g/eq.), 20 parts by weight of a biphenyl aralkyl phenolic resin (KAYAHARD GPH-103, manufactured by Nippon Kayaku Co., Ltd., hydroxyl group equivalent: 231 g/eq.), and 60 parts by weight of a phenol biphenyl aralkyl epoxy resin (NC-3000-FH) were used instead of the naphthol aralkyl phenolic resin.

Example 4

The procedure of Example 1 was repeated, except that 25 parts by weight of a naphthalene phenolic resin (EPICLON EXB-9500, manufactured by DIC, hydroxyl group equivalent:153 g/eq.) and 25 parts by weight of a biphenyl aralkyl phenolic resin (KAYAHARD GPH-103, manufactured by Nippon Kayaku Co., Ltd., hydroxyl group equivalent: 231 g/eq.) were used instead of the naphthol aralkyl phenolic resin, and 50 parts by weight of a phenol novolak epoxy resin (N-770, epoxy equivalent: 190 g/eq., manufactured by DIC) was used instead of the phenol biphenyl aralkyl epoxy resin.

Example 5

The procedure of Example 1 was repeated, except that the amount of the naphthol aralkyl phenolic resin was reduced by 10 parts by weight, the amount of the phenol biphenyl aralkyl epoxy resin was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 6

The procedure of Example 2 was repeated, except that the amount of the naphthol aralkyl phenolic resin was reduced by 10 parts by weight, the amount of the phenol novolak epoxy resin was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 7

The procedure of Example 3 was repeated, except that the amount of the naphthalene phenolic resin (EPICLON EXB-9500) was reduced by 5 parts by weight, the amount of the biphenyl aralkyl phenolic resin (KAYAHARD GPH-103) was reduced by 5 parts by weight, the amount of the phenol biphenyl aralkyl epoxy resin was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 8

The procedure of Example 4 was repeated, except that the amount of the naphthalene phenolic resin (EPICLON EXB-9500) was reduced by 5 parts by weight, the amount of the biphenyl aralkyl phenolic resin (KAYAHARD GPH-103) was reduced by 5 parts by weight, the amount of the phenol novolak epoxy resin was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 9

The procedure of Example 5 was repeated, except that 10 parts by weight of a silicone powder (KMP-605) was added.

Example 10

The procedure of Example 6 was repeated, except that 10 parts by weight of a silicone powder (KMP-605) was added.

Example 11

The procedure of Example 7 was repeated, except that 10 parts by weight of a silicone powder (KMP-605) was added.

Example 12

The procedure of Example 8 was repeated, except that 10 parts by weight of a silicone powder (KMP-605) was added.

Example 13

The procedure of Example 5 was repeated, except that 20 parts by weight of a silicone powder (KMP-605) was added.

Example 14

The procedure of Example 9 was repeated, except that 90 parts by weight of an inorganic filler (A) that is a mixture composed of hydromagnesite and huntite (HyperCarb2050, hydromagnesite:huntite weight ratio=20 to 40:80 to 60, manufactured by Minelco, structure of hydromagnesite: $4MgCO_3 \cdot Mg(OH)_2 \cdot 4H_2O$) was used instead of 90 parts by weight of the inorganic filler (A) that is a mixture composed of hydromagnesite and huntite (UltraCarb1200).

Example 15

The procedure of Example 9 was repeated, except that 200 parts by weight of an inorganic filler (A) that is a mixture composed of hydromagnesite and huntite (UltraCarb1200) was added.

Example 16

The procedure of Example 9 was repeated, except that 5 parts by weight of an inorganic filler (A) that is a mixture composed of hydromagnesite and huntite (UltraCarb1200) and 85 parts by weight of spherical silica (SFP-130MC; manufactured by Denki Kagaku Kogyo K.K.; particle diameter 0.7 μm) were added.

Example 17

The procedure of Example 1 was repeated, except that 45 parts by weight of an α-Naphthol aralkyl cyanate ester compound (cyanate equivalent: 261 g/eq.) prepared in Synthesis Example 1 was used instead of the naphthol aralkyl phenolic resin.

Example 18

The procedure of Example 17 was repeated, except that a prepolymer of 2,2-bis(4-cyanatophenyl)propane (CA210, cyanate equivalent: 139, manufactured by Mitsubishi Gas Chemical Co., Inc.) (30 parts by weight) was used instead of the α-naphthol aralkyl cyanate ester compound prepared in Synthesis Example 1 and the phenol biphenyl aralkyl epoxy resin (NC-3000-FH) was used in an amount of 70 parts by weight.

Example 19

The procedure of Example 17 was repeated, except that 60 parts by weight of an α-naphthol aralkyl cyanate ester compound prepared in Synthesis Example 1 was used and 40 parts by weight of a phenol novolak epoxy resin (N-770) was used instead of the phenol biphenyl aralkyl epoxy resin.

Example 20

The procedure of Example 18 was repeated, except that 40 parts by weight of a prepolymer of 2,2-bis(4-cyanatephenyl)propane (CA210, cyanate equivalent 139, manufactured by Mitsubishi Gas Chemical Co., Inc.) and 60 parts by weight of a phenol novolak epoxy resin (N-770) were used.

Example 21

The procedure of Example 17 was repeated, except that the amount of the α-naphthol aralkyl cyanate ester compound prepared in Synthesis Example 1 was reduced by 10 parts by weight, the amount of the phenol biphenyl aralkyl epoxy resin (NC-3000-FH) was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 22

The procedure of Example 18 was repeated, except that the amount of the prepolymer of 2,2-bis(4-cyanatophenyl)propane (CA210) was reduced by 5 parts by weight, the amount of the phenol biphenyl aralkyl epoxy resin (NC-3000-FH) was reduced by 15 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 23

The procedure of Example 19 was repeated, except that the amount of the α-naphthol aralkyl cyanate ester compound prepared in Synthesis Example 1 was reduced by 15 parts by weight, the amount of the phenol novolak epoxy resin (N-770) was reduced by 5 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 24

The procedure of Example 20 was repeated, except that the amount of the prepolymer of 2,2-bis(4-cyanatephenyl)propane (CA210) was reduced by 5 parts by weight, the amount of the phenol novolak epoxy resin (N-770) was reduced by 15 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 25

The procedure of Example 21 was repeated, except that 10 parts by weight of a silicone powder (KMP-605) was added.

Example 26

A prepreg was obtained in the same manner as in Example 22, except that 10 parts by weight of a silicone powder (KMP-605) was added.

Example 27

The procedure of Example 23 was repeated, except that 10 parts by weight of a silicone powder (KMP-605) was added.

Example 28

The procedure of Example 24 was repeated, except that 10 parts by weight of a silicone powder (KMP-605) was added.

Example 29

A BT resin (BT2610, manufactured by Mitsubishi Gas Chemical Company, Inc.) (60 parts by weight) prepared in Synthesis Example 2, 30 pars by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were mixed together to obtain a varnish. This varnish was diluted with methyl ethyl ketone. The diluted varnish was impregnated into and coated on a 0.1 mm-thick E-glass woven fabric. The impregnated and coated E-glass woven fabric was heat-dried at 160° C. for 4 min to obtain a prepreg having a resin content of 50% by weight. A metal foil-clad laminated sheet was obtained in the same manner as in Example 1.

Example 30

The procedure of Example 29 was repeated, except that 50 parts by weight of BT9510 (manufactured by Mitsubishi Gas Chemical Company, Inc.) prepared in Synthesis Example 3 was used as the BT resin and the phenol biphenyl aralkyl epoxy resin (NC-3000-FH) was used in an amount of 40 parts by weight.

Example 31

The procedure of Example 29 was repeated, except that the amount of the BT resin (BT2610) prepared in Synthesis Example 2 was reduced by 10 parts by weight, the amount of the phenol biphenyl aralkyl epoxy resin (NC-3000-FH) was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 32

The procedure of Example 30 was repeated, except that the amount of the BT resin (BT9510) prepared in Synthesis Example 3 was reduced by 10 parts by weight, the amount of the phenol biphenyl aralkyl epoxy resin (NC-3000-FH) was reduced by 10 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 33

The procedure of Example 31 was repeated, except that 10 parts by weight of a silicone powder (KMP-605) was added.

Example 34

The procedure of Example 32 was repeated, except that 10 parts by weight of a silicone powder (KMP-605) was added.

Example 35

A biphenyl aralkyl phenolic resin (KAYAHARD GPH-103, manufactured by Nippon Kayaku Co., Ltd., hydroxyl group equivalent: 231 g/eq.) (10 parts by weight), 55 parts by weight of the BT resin (BT2610) prepared in Synthesis Example 2, 25 parts by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were mixed together to obtain a varnish. This varnish was diluted with methyl ethyl ketone. The diluted varnish was impregnated into and coated on a 0.1 mm-thick E-glass woven fabric. The impregnated and coated E-glass woven fabric was heat-dried at 160° C. for 4 min to obtain a prepreg having a resin content of 50% by weight. A metal laminated sheet was obtained in the same manner as in Example 1.

Example 36

The procedure of Example 35 was repeated, except that 40 parts by weight of BT9510 prepared in Synthesis Example 3 was used as the BT resin and the phenol biphenyl aralkyl epoxy resin (NC-3000-FH) was used in an amount of 40 parts by weight.

Example 37

The procedure of Example 35 was repeated, except that the amount of the biphenyl aralkyl phenolic resin (KAYA-HARD GPH-103) was reduced by 5 parts by weight, the amount of the BT resin (BT2610) prepared in Synthesis Example 2 was reduced by 5 parts by weight, the amount of the phenol biphenyl aralkyl epoxy resin (NC-3000-FH) was reduced by 5 parts by weight, the amount of the phenol novolak epoxy resin (N-770) was reduced by 5 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 38

The procedure of Example 36 was repeated, except that the amount of the biphenyl aralkyl phenolic resin (KAYA-HARD GPH-103) was reduced by 5 parts by weight, the amount of the BT resin (BT9510) prepared in Synthesis Example 3 was reduced by 5 parts by weight, the amount of the phenol biphenyl aralkyl epoxy resin (NC-3000-FH) was reduced by 5 parts by weight, the amount of the phenol novolak epoxy resin (N-770) was reduced by 5 parts by weight, 20 parts by weight of bis(3-ethyl-5-methyl-4-maleimidephenyl)methane was used instead of the reduced 20 parts by weight, and the talc coated with zinc molybdate (ChemGuard 911C) was not used.

Example 39

The procedure of Example 37 was repeated, except that 10 parts by weight of a silicone powder (KMP-605) was added.

Example 40

The procedure of Example 38 was repeated, except that 10 parts by weight of a silicone powder (KMP-605) was added.

Example 41

The procedure of Example 1 was repeated, except that 10 parts by weight of a biphenyl aralkyl phenolic resin (KAYA-HARD GPH-103), 10 parts by weight of the α-naphthol aralkyl cyanate ester compound prepared in Synthesis Example 1, 45 parts by weight of the BT resin (BT2610) prepared in Synthesis Example 2, 25 parts by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were used.

Example 42

The procedure of Example 1 was repeated, except that 10 parts by weight of a biphenyl aralkyl phenolic resin (KAYA-HARD GPH-103), 10 parts by weight of a novolak cyanate ester compound (Primaset PT-30), 35 parts by weight of the BTresin (BT9510) prepared in Synthesis Example 3, 35 parts by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were used.

Example 43

The procedure of Example 1 was repeated, except that 10 parts by weight of the α-naphthol aralkyl cyanate ester compound prepared in Synthesis Example 1, 50 parts by weight of the BT resin (BT2610) prepared in Synthesis Example 2, 30 parts by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were used.

Example 44

The procedure of Example 1 was repeated, except that 10 parts by weight of a novolak cyanate ester compound (Primaset PT-30), 40 parts by weight of the BT resin (BT9510) prepared in Synthesis Example 3, 40 parts by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were used.

Example 45

The procedure of Example 1 was repeated, except that 10 parts by weight of a biphenyl aralkyl phenolic resin (KAYA-HARD GPH-103), 40 parts by weight of the α-naphthol aralkyl cyanate ester compound prepared in Synthesis Example 1, 50 parts by weight of a phenol biphenyl aralkyl epoxy resin (NC-3000-FH), 1.5 parts by weight of a wetting/ dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were used.

Example 46

The procedure of Example 1 was repeated, except that 10 parts by weight of a biphenyl aralkyl phenolic resin (KAYA-HARD GPH-103), 40 parts by weight of a novolak cyanate ester compound (Primaset PT-30), 40 parts by weight of a phenol biphenyl aralkyl epoxy resin (NC-3000-FH), 10 parts by weight of a phenol novolak epoxy resin (N-770), 1.5 parts by weight of a wetting/dispersing agent (BYK-W903), 90 parts by weight of an inorganic filler (A) that is a mixture composed of hydromagnesite and huntite (Ultracarb1200), 10 parts by weight of talc coated with zinc molybdate (ChemGuard 911C), and 0.01 part by weight of zinc octylate were used.

Example 47

The procedure of Example 3 was repeated, except that 250 parts by weight of an inorganic filler (A) that is a mixture composed of hydromagnesite and huntite was added.

Comparative Example 1

The procedure of Example 1 was repeated, except that 90 parts by weight of spherical silica (SFP-130MC) was used instead of 90 parts by weight of the inorganic filler (A) that is a mixture composed of hydromagnesite and huntite (Ultracarb1200). The product was inferior in accuracy of hole position to that in Example 1.

Comparative Example 2

The procedure of Example 1 was repeated, except that 40 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion, was lower in flame retardance, and was lower in accuracy of hole position than the product in Example 1.

Comparative Example 3

The procedure of Example 1 was repeated, except that 90 parts by weight of boehmite (APYRAL AOH60, manufactured by Nabaltec) was used instead of 90 parts by weight of the inorganic filler (A) that is a mixture composed of hydromagnesite and huntite (Ultracarb1200). The product was larger in coefficient of thermal expansion and was also lower in flame retardance than the product in Example 1.

Comparative Example 4

The procedure of Example 1 was repeated, except that 120 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion, was lower in flame retardance, and was lower in the accuracy of hole position than that in Example 1.

Comparative Example 5

The procedure of Example 3 was repeated, except that 90 parts by weight of aluminum hydroxide (CL-303, manufactured by Sumitomo Chemical Co., Ltd.) was used instead of 90 parts by weight of the inorganic filler (A) that is a mixture composed of hydromagnesite and huntite (Ultracarb1200), 40 parts by weight of a phenolic resin (PHENOLITE TD-2093, manufactured by DIC, hydroxyl group equivalent: 105) was used instead of 20 parts by weight of the naphthalene phenolic resin (EPICLON EXB-9500) and 20 parts by weight of the biphenyl aralkyl phenolic resin (KAYA-HARD GPH-103), and 60 parts by weight of a phenol novolak epoxy resin (DEN438, manufactured by The Dow Chemical Company, epoxy equivalent: 179 g/eq.) was used instead 60 parts by weight of the phenol biphenyl aralkyl epoxy resin (NC-3000-FH). The product was larger in coefficient of thermal expansion, was lower in flame retardance, and was lower in heat resistance than the product in Example 3.

Comparative Example 6

The procedure of Example 3 was repeated, except that 90 parts by weight of magnesium hydroxide (Kisuma 8SN, manufactured by Kyowa Chemical Industry, Co., Ltd.) was used instead of 90 parts by weight of the inorganic filler (A) that is a mixture composed of hydromagnesite and huntite (Ultracarb1200), 40 parts by weight of a phenolic resin (TD-2093) was used instead of 20 parts by weight of the naphthalene phenolic resin (EPICLON EXB-9500) and 20 parts by weight of the biphenyl aralkyl phenolic resin (KAYAHARD GPH-103), and 60 parts by weight of a phenol novolak epoxy resin (DEN438) was used instead of the phenol biphenyl aralkyl epoxy resin (NC-3000-FH). The product was larger in coefficient of thermal expansion, was lower in flame retardance, and was lower in heat resistance than the product in Example 3.

Comparative Example 7

The procedure of Example 5 was repeated, except that 90 parts by weight of spherical silica (SFP-130MC) was used instead of 90 parts by weight of the inorganic filler (A) that is a mixture composed of hydromagnesite and huntite (Ultracarb1200). The product was inferior in accuracy of hole position to that in Example 5.

Comparative Example 8

The procedure of Example 5 was repeated, except 40 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion, was lower in flame retardance, and was lower in the accuracy of hole position than the product in Example 5.

Comparative Example 9

The procedure of Example 5 was repeated, except that 90 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion and was lower in flame retardance than the product in Example 5.

Comparative Example 10

The procedure of Example 5 was repeated, except that 120 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion, was lower in flame retardance, and was lower in the accuracy of hole position than the product in Example 5.

Comparative Example 11

The procedure of Example 7 was repeated, except that 90 parts by weight of aluminum hydroxide (CL-303) was used instead of 90 parts by weight of the inorganic filler (A) that is a mixture composed of hydromagnesite and huntite (Ultracarb1200), 40 parts by weight of a phenolic resin (TD-2093) was used instead of 15 parts by weight of the naphthalene phenolic resin (EPICLON EXB-9500) and 15 parts by weight of the biphenyl aralkyl phenolic resin (KAYAHARD GPH-103), and 50 parts by weight of a phenol novolak epoxy resin (DEN438) was used instead of 50 parts by weight of the phenol biphenyl aralkyl epoxy resin (NC-3000-FH). The product was larger in coefficient of thermal expansion, was lower in flame retardance, and was lower in heat resistance.

Comparative Example 12

The procedure of Example 7 was repeated, except that 90 parts by weight of magnesium hydroxide (Kisuma 8SN) was used instead of 90 parts by weight of the inorganic filler (A) that is a mixture composed of hydromagnesite and huntite (Ultracarb1200), 40 parts by weight of a phenolic resin (TD-2093) was used instead of 15 parts by weight of the naphthalene phenolic resin (EPICLON EXB-9500) and 15 parts by weight of the biphenyl aralkyl phenolic resin (KAYAHARD GPH-103), and 50 parts by weight of a phenol novolak epoxy resin (DEN438) was used instead of 50 parts by weight of the phenol biphenyl aralkyl epoxy resin (NC-3000-FH). The product was larger in coefficient of thermal expansion, lower in flame retardance, and lower in heat resistance than that in Example 7.

Comparative Example 13

The procedure of Example 9 was repeated, except that 90 parts by weight of spherical silica (SFP-130MC) was used instead of 90 parts by weight of the inorganic filler (A) that is a mixture composed of hydromagnesite and huntite (Ultracarb1200). The product was lower in the accuracy of hole position than that in Example 9.

Comparative Example 14

The procedure of Example 9 was repeated, except that 40 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion and lower in flame retardance than that in Example 9.

Comparative Example 15

The procedure of Example 9 was repeated, except that 90 parts by weight of boehmite (APYRAL AOH60) was used instead of 90 parts by weight of the inorganic filler (A) that is a mixture composed of hydromagnesite and huntite (Ultracarb1200). The product was lower in flame retardance than that in Example 9.

Comparative Example 16

The procedure of Example 9 was repeated, except that 120 parts by weight of boehmite (APYRAL AOH60) was used instead of 90 parts by weight of the inorganic filler (A) that is a mixture composed of hydromagnesite and huntite (Ultracarb1200). The product was lower in flame retardance than that in Example 9.

Comparative Example 17

The procedure of Example 11 was repeated, except that 90 parts by weight of aluminum hydroxide (CL-303) was used instead of 90 parts by weight of the inorganic filler (A) that is a mixture composed of hydromagnesite and huntite (Ultracarb1200), 40 parts by weight of a phenolic resin (TD-2093) was used instead of 15 parts by weight of the naphthalene phenolic resin (EPICLON EXB-9500) and 15 parts by weight of the biphenyl aralkyl phenolic resin (KAYAHARD GPH-103), and 50 parts by weight of a phenol novolak epoxy resin (DEN438) was used instead of 50 parts by weight of the phenol biphenyl aralkyl epoxy resin (NC-3000-FH). The product was larger in coefficient of thermal expansion and lower in heat resistance than that in Example 11.

Comparative Example 18

The procedure of Example 11 was repeated, except that 90 parts by weight of magnesium hydroxide (Kisuma 8SN) was used instead of 90 parts by weight of the inorganic filler (A) that is a mixture composed of hydromagnesite and huntite (Ultracarb1200), 40 parts by weight of a phenolic resin (TD-2093) was used instead of 15 parts by weight of the naphthalene phenolic resin (EPICLON EXB-9500) and 15 parts by weight of the biphenyl aralkyl phenolic resin (KAYAHARD GPH-103), and 50 parts by weight of a phenol novolak epoxy resin (DEN438) was used instead of 50 parts by weight of the phenol biphenyl aralkyl epoxy resin (NC-3000-FH). The product was larger in coefficient of thermal expansion and lower in heat resistance than that in Example 11.

Comparative Example 19

The procedure of Example 17 was repeated, except that 90 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion and lower in the accuracy of hole position than that in Example 17.

Comparative Example 20

The procedure of Example 17 was repeated, except that 40 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion, lower in flame retardance, and lower in the accuracy of hole position than that in Example 17.

Comparative Example 21

The procedure of Example 17 was repeated, except that 90 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion and lower in flame retardance than that in Example 17.

Comparative Example 22

The procedure of Example 17 was repeated, except that 120 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion, lower in flame retardance, and lower in the accuracy of hole position than that in Example 17.

Comparative Example 23

The procedure of Example 17 was repeated, except that 90 parts by weight of aluminum hydroxide (CL-303) was used instead of 90 parts by weight of the inorganic filler (A) that is a mixture composed of hydromagnesite and huntite (Ultracarb1200). The product was larger in coefficient of thermal expansion, lower in flame retardance, and lower in heat resistance than that in Example 17.

Comparative Example 24

The procedure of Example 17 was repeated, except that 120 parts by weight of magnesium hydroxide (Kisuma 8SN) was used instead of 90 parts by weight of the inorganic filler (A) that is a mixture composed of hydromagnesite and huntite (Ultracarb1200). The product was larger in coefficient of thermal expansion, lower in flame retardance, and lower in heat resistance than that in Example 17.

Comparative Example 25

The procedure of Example 21 was repeated, except that 90 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion and lower in the accuracy of hole position than that in Example 21.

Comparative Example 26

The procedure of Example 21 was repeated, except that 40 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion, lower in flame retardance, and lower in the accuracy of hole position than that in Example 21.

Comparative Example 27

The procedure of Example 21 was repeated, except that 90 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion and lower in flame retardance than that in Example 21.

Comparative Example 28

The procedure of Example 21 was repeated, except that 120 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion, lower in flame retardance, lower in the accuracy of hole position than that in Example 21.

Comparative Example 29

The procedure of Example 21 was repeated, except that 90 parts by weight of aluminum hydroxide (CL-303) was used instead of 90 parts by weight of the inorganic filler (A) that is a mixture composed of hydromagnesite and huntite (Ultracarb1200). The product was larger in coefficient of thermal expansion, lower in flame retardance, lower in heat resistance than that in Example 21.

Comparative Example 30

The procedure of Example 21 was repeated, except that 120 parts by weight of magnesium hydroxide (Kisuma 8SN) was used instead of 90 parts by weight of the inorganic filler (A) that is a mixture composed of hydromagnesite and huntite (Ultracarb1200). The product was larger in coefficient of thermal expansion, lower in flame retardance, lower in heat resistance than that in Example 21.

Comparative Example 31

The procedure of Example 25 was repeated, except that 90 parts by weight of spherical silica (SFP-130MC) was used instead of 90 parts by weight of the inorganic filler (A) that is a mixture composed of hydromagnesite and huntite (Ultracarb1200). The product was lower in the accuracy of hole position than that in Example 25.

Comparative Example 32

The procedure of Example 25 was repeated, except that 40 parts by weight of spherical silica (SFP-130MC) was used instead of 90 parts by weight of the inorganic filler (A) that is a mixture composed of hydromagnesite and huntite (Ultracarb1200). The product was larger in coefficient of thermal expansion and lower in flame retardance than that in Example 25.

Comparative Example 33

The procedure of Example 25 was repeated, except that 90 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion and lower in flame retardance than that in Example 25.

Comparative Example 34

The procedure of Example 25 was repeated, except that 120 parts by weight of boehmite (APYRAL AOH60) was used instead of 90 parts by weight of the inorganic filler (A) that is a mixture composed of hydromagnesite and huntite (Ultracarb1200). The product was larger in coefficient of thermal expansion and lower in flame retardance than that in Example 25.

Comparative Example 35

The procedure of Example 25 was repeated, except that 90 parts by weight of aluminum hydroxide (CL-303) was used instead of 90 parts by weight of the inorganic filler (A) that is a mixture composed of hydromagnesite and huntite (Ultracarb1200). The product was larger in coefficient of thermal expansion and lower in heat resistance than that in Example 25.

Comparative Example 36

The procedure of Example 25 was repeated, except that 120 parts by weight of magnesium hydroxide (Kisuma 8SN) was used instead of 90 parts by weight of the inorganic filler (A) that is a mixture composed of hydromagnesite and huntite (Ultracarb1200). The product was larger in coefficient of thermal expansion, lower in heat resistance than that in Example 25.

Comparative Example 37

The procedure of Example 3 was repeated, except that the inorganic filler (A) that is a mixture composed of hydromagnesite and huntite (Ultracarb1200) was not added. The product was larger in coefficient of thermal expansion, lower in flame retardance than that in Example 3.

Comparative Example 38

The procedure of Example 3 was repeated, except that the phenol biphenyl aralkyl epoxy resin (NC-3000-FH) was not added. As a result, the product was not cured.

Comparative Example 39

The procedure of Example 3 was repeated, except that the naphthalene phenolic resin (EPICLON EXB-9500) and the biphenyl aralkyl phenolic resin (KAYAHARD GPH-103) were not added. As a result, the product was not cured.

Comparative Example 40

The procedure of Example 3 was repeated, except that the phenol biphenyl aralkyl epoxy resin (NC-3000-FH) was changed to a polyethylene resin (Novatec HD, manufactured by Japan Polyethylene Corporation). As a result, the product was not cured.

TABLE 1

| | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Flame retardance | V-0 | V-0 | V-0 | V-0 | V-0 | V-0 | V-0 | V-0 | V-0 | V-0 | V-0 |
| Heat resistance | >30 min | >30 min | >30 min | >30 min | >30 min | >30 min | >30 min | >30 min | >30 min | >30 min | >30 min |
| Coefficient of thermal expansion | 10.0 | 10.0 | 9.5 | 9.5 | 10.0 | 10.0 | 9.5 | 9.5 | 8.5 | 8.5 | 8.0 |
| Accuracy of hole position | 0.06 | 0.06 | 0.065 | 0.065 | 0.06 | 0.06 | 0.065 | 0.065 | 0.05 | 0.05 | 0.055 |

| | Example 12 | Example 13 | Example 14 | Example 15 | Example 16 | Example 17 | Example 18 | Example 19 | Example 20 | Example 21 | Example 22 | Example 23 |
|---|---|---|---|---|---|---|---|---|---|---|---|---|
| Flame retardance | V-0 | V-0 | V-0 | V-0 | V-0 | V-0 | V-0 | V-0 | V-0 | V-0 | V-0 | V-0 |
| Heat resistance | >30 min | >30 min | >30 min | >30 min | >30 min | >30 min | >30 min | >30 min | >30 min | >30 min | >30 min | >30 min |
| Coefficient of thermal expansion | 8.0 | 8.5 | 8.5 | 8.5 | 9.0 | 10.5 | 10.5 | 10.5 | 10.5 | 10.5 | 10.5 | 10.5 |
| Accuracy of hole position | 0.055 | 0.05 | 0.05 | 0.065 | 0.6 | 0.075 | 0.075 | 0.075 | 0.075 | 0.075 | 0.075 | 0.075 |

| | Example 24 | Example 25 | Example 26 | Example 27 | Example 28 | Example 29 | Example 30 | Example 31 | Example 32 | Example 33 | Example 34 | Example 35 |
|---|---|---|---|---|---|---|---|---|---|---|---|---|
| Flame retardance | V-0 | V-0 | V-0 | V-0 | V-0 | V-0 | V-0 | V-0 | V-0 | V-0 | V-0 | V-0 |
| Heat resistance | >30 min | >30 min | >30 min | >30 min | >30 min | >30 min | >30 min | >30 min | >30 min | >30 min | >30 min | >30 min |
| Coefficient of thermal expansion | 10.5 | 9.0 | 9.0 | 9.0 | 9.0 | 10.5 | 10.5 | 10.5 | 10.5 | 9.0 | 9.0 | 10.5 |
| Accuracy of hole position | 0.075 | 0.065 | 0.065 | 0.065 | 0.065 | 0.075 | 0.075 | 0.075 | 0.075 | 0.065 | 0.065 | 0.065 |

| | Example 36 | Example 37 | Example 38 | Example 39 | Example 40 | Example 41 | Example 42 | Example 43 | Example 44 | Example 45 | Example 46 | Example 47 |
|---|---|---|---|---|---|---|---|---|---|---|---|---|
| Flame retardance | V-0 | V-0 | V-0 | V-0 | V-0 | V-0 | V-0 | V-0 | V-0 | V-0 | V-0 | V-0 |
| Heat resistance | >30 min | >30 min | >30 min | >30 min | >30 min | >30 min | >30 min | >30 min | >30 min | >30 min | >30 min | >30 min |
| Coefficient of thermal expansion | 10.5 | 10.5 | 10.5 | 9.0 | 9.0 | 10.5 | 10.5 | 10.5 | 10.5 | 10.5 | 10.5 | 8.0 |
| Accuracy of hole position | 0.065 | 0.065 | 0.065 | 0.055 | 0.055 | 0.075 | 0.075 | 0.075 | 0.075 | 0.075 | 0.075 | 0.080 |

TABLE 2

|  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|
| Flame retardance | V-0 | V-1 | V-1 | V-1 | V-1 | V-1 | V-0 | V-1 | V-1 | V-1 |
| Heat resistance | >30 min | >30 min | >30 min | >30 min | 5 min | 3 min | >30 min | >30 min | >30 min | >30 min |
| Coefficient of thermal expansion | 10.5 | 12.5 | 11.5 | 11.5 | 12.5 | 12.5 | 10.5 | 12.5 | 11.5 | 11.5 |
| Accuracy of hole position | 0.075 | 0.070 | 0.065 | 0.070 | 0.030 | 0.030 | 0.075 | 0.070 | 0.065 | 0.070 |
|  | Comparative Example 11 | Comparative Example 12 | Comparative Example 13 | Comparative Example 14 | Comparative Example 15 | Comparative Example 16 | Comparative Example 17 | Comparative Example 18 | Comparative Example 19 | Comparative Example 20 |
| Flame retardance | V-1 | V-1 | V-1 | V-1 | V-1 | V-1 | V-0 | V-0 | V-0 | V-1 |
| Heat resistance | 5 min | 3 min | >30 min | >30 min | >30 min | >30 min | 5 min | 3 min | >30 min | >30 min |
| Coefficient of thermal expansion | 12.5 | 12.5 | 9.0 | 11.0 | 10.0 | 10.0 | 11.0 | 11.0 | 11.5 | 13.5 |
| Accuracy of hole position | 0.030 | 0.030 | 0.065 | 0.060 | 0.055 | 0.060 | 0.02 | 0.020 | 0.085 | 0.08 |
|  | Comparative Example 21 | Comparative Example 22 | Comparative Example 23 | Comparative Example 24 | Comparative Example 25 | Comparative Example 26 | Comparative Example 27 | Comparative Example 28 | Comparative Example 29 | Comparative Example 30 |
| Flame retardance | V-1 | V-1 | V-1 | V-1 | V-0 | V-1 | V-1 | V-1 | V-1 | V-1 |
| Heat resistance | >30 min | >30 min | 5 min | 3 min | >30 min | >30 min | >30 min | >30 min | 5 min | 3 min |
| Coefficient of thermal expansion | 12.5 | 12.5 | 13.5 | 13.5 | 11.5 | 13.5 | 12.5 | 12.5 | 13.5 | 13.5 |
| Accuracy of hole position | 0.075 | 0.080 | 0.040 | 0.040 | 0.085 | 0.08 | 0.075 | 0.080 | 0.040 | 0.040 |
|  | Comparative Example 31 | Comparative Example 32 | Comparative Example 33 | Comparative Example 34 | Comparative Example 35 | Comparative Example 36 | Comparative Example 37 | Comparative Example 38 | Comparative Example 39 | Comparative Example 40 |
| Flame retardance | V-0 | V-1 | V-1 | V-1 | V-0 | V-0 | V-1 | Not curable | Not curable | Not curable |
| Heat resistance | >30 min | >30 min | >30 min | >30 min | 5 min | 3 min | >30 min |  |  |  |
| Coefficient of thermal expansion | 10.0 | 12.0 | 11.0 | 11.0 | 12.0 | 12.0 | 13.0 |  |  |  |
| Accuracy of hole position | 0.075 | 0.07 | 0.065 | 0.070 | 0.030 | 0.030 | 0.045 |  |  |  |

Thus, it was confirmed that the laminated sheets obtained using the prepregs according to the present invention have a high level of heat resistance, a low coefficient of thermal expansion, and a high level of drilling workability and, at the same time, can retain a high level of flame retardance without the need to use halogenated flame retardants and phosphorus compounds as flame retardants.

The invention claimed is:

1. A prepreg, comprising:
   a base material; and
   a resin composition impregnated into or coated on said base material,
   the resin composition comprising:
   (A) an inorganic filler that is a mixture composed of a hydromagnesite represented by formula (1):

$x\text{MgCO}_3 \cdot y\text{Mg(OH)}_2 \cdot z\text{H}_2\text{O}$     (1)

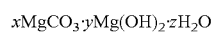

wherein x:y:z is
   4:1:4,
   4:1:5,
   4:1:6,
   4:1:7,
   3:1:3, or
   3:1:4
   and huntite;
   (B) an epoxy resin;
   (C) a curing agent; and
   (D) a silicone powder.

2. A laminated sheet comprising a lamination-molded product of a prepreg according to claim 1.

3. A metal foil-clad laminated sheet comprising
   a lamination-molded product of a prepreg according to claim 1 and
   a metal foil provided on the prepreg.

4. The prepreg according to claim 1, wherein the hydromagnesite represented by formula (1) is one represented by formula (2):

$4\text{MgCO}_3 \cdot \text{Mg(OH)}_2 \cdot 4\text{H}_2\text{O}$     (2).

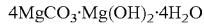

5. The prepreg according to claim 1, wherein the hydromagnesite: huntite weight ratio in the inorganic filler (A) is in the range of 10:90 to 45:55.

6. The prepreg according to claim 1, wherein the curing agent (C) is at least one material selected from the group consisting of cyanate ester compounds, BT resins, and phenolic resins.

7. The prepreg according to claim 6, wherein the cyanate ester compound is a naphthol aralkyl cyanate ester compound represented by formula (5):

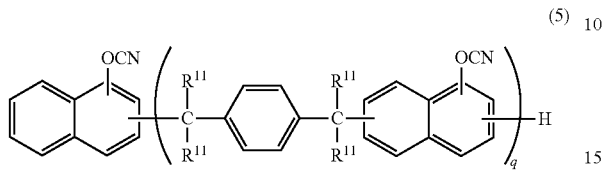

(5)

wherein $R^{11}$ represents a hydrogen atom or a methyl group; and q is an integer of 1 or more, or
the BT resin is a resin produced using the naphthol aralkyl cyanate ester compound represented by formula (5) as a raw material.

8. The prepreg according to claim 6, wherein the phenolic resin is at least one resin selected from the group consisting of naphthol aralkyl phenolic resins, biphenyl aralkyl phenolic resins, and naphthalene phenolic resins.

9. The prepreg according to claim 6, wherein the phenolic resin is a naphthol aralkyl phenolic resin represented by formula (6):

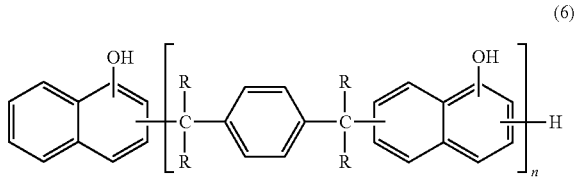

(6)

wherein R represents a hydrogen atom or a methyl group; and n is an integer of 1 or more.

10. The prepreg according to claim 1, wherein the epoxy resin (B) is at least one of phenol novolak epoxy resins and aralkyl novolak epoxy resins.

11. The prepreg according to claim 1, wherein the epoxy resin (B) is an aralkyl novolak epoxy resin represented by formula (3):

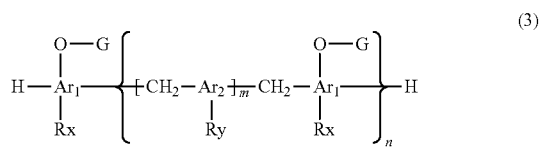

(3)

wherein $Ar_1$s, which may be the same or different, represent and $Ar_2$ represents or when present in plural which may be the same or different, represent an aryl group in which the substituent is a monocyclic or polycyclic aromatic hydrocarbon of a phenyl, naphthyl, or biphenyl group; Rxs, which may be the same or different, and Ry represents or when present in plural which may be the same or different, represent a hydrogen atom or an alkyl or aryl group; m is an integer of 1 to 5; n is an integer of 1 to 50; and G represents a glycidyl group.

12. The prepreg according to claim 1, wherein the resin composition further comprises a maleimide compound.

13. The prepreg according to claim 1, wherein the mixing amount of the inorganic filler (A) is 5 to 250 parts by weight based on 100 parts by weight in total of the epoxy resin (B) and the curing agent (C).

14. The prepreg according to claim 1, wherein the mixing amount of the epoxy resin (B) is 5 to 70 parts by weight based on 100 parts by weight in total of the epoxy resin (B) and the curing agent (C).

\* \* \* \* \*